(12) United States Patent
Akamatsu (10) Patent No.: US 8,729,641 B2
(45) Date of Patent: May 20, 2014

(54) SEMICONDUCTOR DEVICE

(75) Inventor: Susumu Akamatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 295 days.

(21) Appl. No.: 13/293,579

(22) Filed: Nov. 10, 2011

(65) Prior Publication Data

US 2012/0056271 A1 Mar. 8, 2012

Related U.S. Application Data

(63) Continuation of application No. PCT/JP2010/000827, filed on Feb. 10, 2010.

(30) Foreign Application Priority Data

Jun. 12, 2009 (JP) ................................. 2009-141320

(51) Int. Cl.
*H01L 27/088* (2006.01)

(52) U.S. Cl.
USPC .................................. 257/392; 257/E27.062

(58) Field of Classification Search
USPC ............. 257/392, 368, 411, E21.19, E27.062
See application file for complete search history.

(56) References Cited

U.S. PATENT DOCUMENTS

| | | | |
|---|---|---|---|
| 5,946,575 A | 8/1999 | Yamaoka et al. | |
| 7,344,934 B2 * | 3/2008 | Li | 438/199 |
| 2002/0000617 A1 * | 1/2002 | Mori et al. | 257/368 |
| 2002/0173066 A1 | 11/2002 | Masuoka | |
| 2004/0032001 A1 * | 2/2004 | Gilmer et al. | 257/500 |
| 2005/0014352 A1 * | 1/2005 | Torii et al. | 438/591 |
| 2006/0170065 A1 * | 8/2006 | Nakanishi et al. | 257/392 |
| 2006/0273401 A1 * | 12/2006 | Tsujikawa et al. | 257/369 |
| 2007/0138571 A1 | 6/2007 | Nakabayashi et al. | |
| 2009/0039411 A1 | 2/2009 | Anezaki | |
| 2009/0197387 A1 * | 8/2009 | Wong et al. | 438/400 |
| 2010/0044804 A1 * | 2/2010 | Chen et al. | 257/410 |
| 2010/0120226 A1 * | 5/2010 | Yamazaki et al. | 438/458 |

FOREIGN PATENT DOCUMENTS

| | | |
|---|---|---|
| JP | 2000-277627 A | 10/2000 |
| JP | 2001-284463 | 10/2001 |
| JP | 2002-343879 | 11/2002 |
| JP | 2007-227536 A | 9/2007 |
| JP | 2007-242685 A | 9/2007 |
| JP | 2008-305950 | 12/2008 |

OTHER PUBLICATIONS

International Search Report issued in International Patent Application No. PCT/JP2010/000827 dated May 18, 2010.

* cited by examiner

*Primary Examiner* — Jarrett Stark (74) *Attorney, Agent, or Firm* — McDermott Will & Emery LLP (57) ABSTRACT

A semiconductor device includes a first, second, and third MIS transistors of a first conductivity type respectively including a first, second, and third gate electrodes on a first, second, and third active regions of a semiconductor substrate with a first, second, and third gate insulating films interposed therebetween. The first gate insulating film is formed of a first silicon oxide film and a first high-k insulating film on the first silicon oxide film. The second gate insulating film is formed of a second silicon oxide film and a second high-k insulating film on the second silicon oxide film. The third gate insulating film is formed of a third silicon oxide film and a third high-k insulating film on the third silicon oxide film. The second silicon oxide film has a same thickness as the first silicon oxide film, and a greater thickness than the third silicon oxide film.

13 Claims, 4 Drawing Sheets

SEMICONDUCTOR DEVICE

CROSS-REFERENCE TO RELATED APPLICATION

This is a continuation of PCT International Application PCT/JP2010/000827 filed on Feb. 10, 2010, which claims priority to Japanese Patent Application No. 2009-141320 filed on Jun. 12, 2009. The disclosures of these applications including the specifications, the drawings, and the claims are hereby incorporated by reference in their entirety.

BACKGROUND

The present disclosure relates to semiconductor devices and manufacturing methods of the devices, and more particularly to semiconductor devices including metal insulator semiconductor field effect transistors (MISFETs) having different operating voltages and manufacturing methods of the devices.

In recent years, with higher integration, higher function, and higher speed of semiconductor integrated circuit devices, miniaturization and higher drive capability of MISFETs (hereinafter referred to as a "MIS transistor") have been required.

On the other hand, lower power consumption of semiconductor integrated circuit devices is also required for reduction in energy consumption and for long-period use of mobile phones. Thus, reduction in operating voltages of MIS transistors for internal circuits progresses. By contrast, input/output (I/O) MIS transistor needs to be connected to external devices, and thus require higher operating voltages than MIS transistors for internal circuits.

Thus, a semiconductor device including a first, second, and third MIS transistors having different operating voltages is suggested. (See, for example, Japanese Patent Publication No. 2002-343879.) A manufacturing method of a conventional semiconductor device will be described below with reference to FIGS. 3A-3C and FIGS. 4A and 4B. FIGS. 3A-4B are cross-sectional illustrating main steps of the manufacturing method of the conventional semiconductor device in a gate length direction in order of the steps. A "first, second, and third MIS regions" shown in FIGS. 3A-4B denote regions in which first, second, and third MIS transistors are formed, respectively. The second MIS transistor has an operating voltage lower than the operating voltage of the first MIS transistor, and higher than the operating voltage of the third MIS transistor.

Figure 3A:
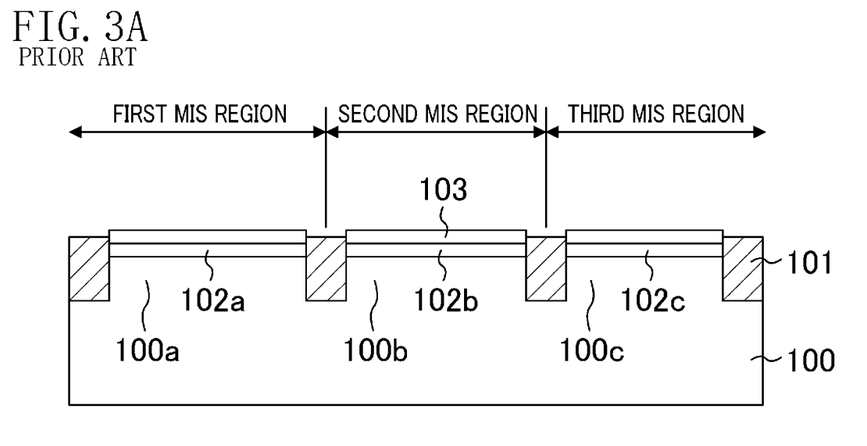
FIGS. 3A-3C are cross-sectional illustrating main steps of a manufacturing method of a conventional semiconductor device in a gate length direction in order of the steps.

First, as shown in FIG. 3A, an isolation region 101 is selectively formed in an upper portion of a semiconductor substrate 100. As a result, a first, second, and third active regions 100a, 100b, and 100c surrounded by the isolation region 101 are formed in the first, second, and third MIS regions of the semiconductor substrate 100, respectively. Then, a first, second, and third channel diffusion layers 102a, 102b, and 102c are formed in upper portions of the first, second, and third active regions 100a, 100b, and 100c, respectively. After that, first thermal oxidation for forming a gate insulating film is performed to provide a first film 103 for forming a silicon oxide film on the first, second, and third active regions 100a, 100b, and 100c.

Figure 3B:
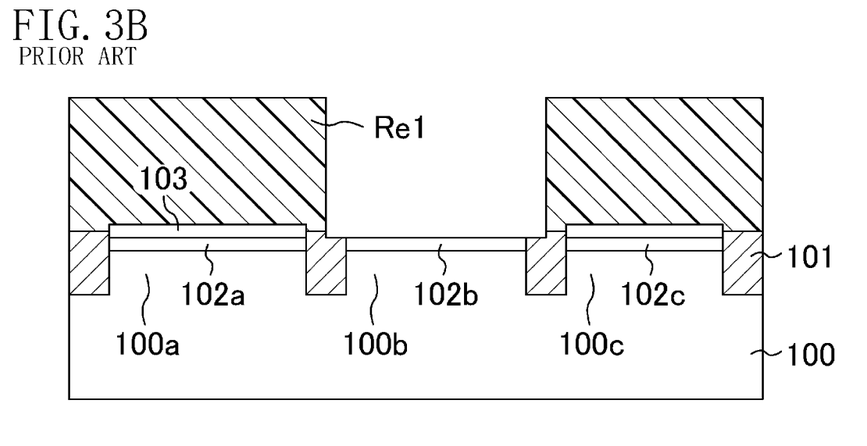

Next, as shown in FIG. 3B, a resist pattern Re1, which covers the first and third MIS regions and exposes the second MIS region, is formed on the first film 103 for forming a silicon oxide film by photolithography. Then, the portion of the first film 103 for forming a silicon oxide film, which is provided in the second MIS region, is removed by etching using the resist pattern Re1 as a mask. This exposes a surface of a second active region 100b. After that, the resist pattern Re1 is removed.

Figure 3C:
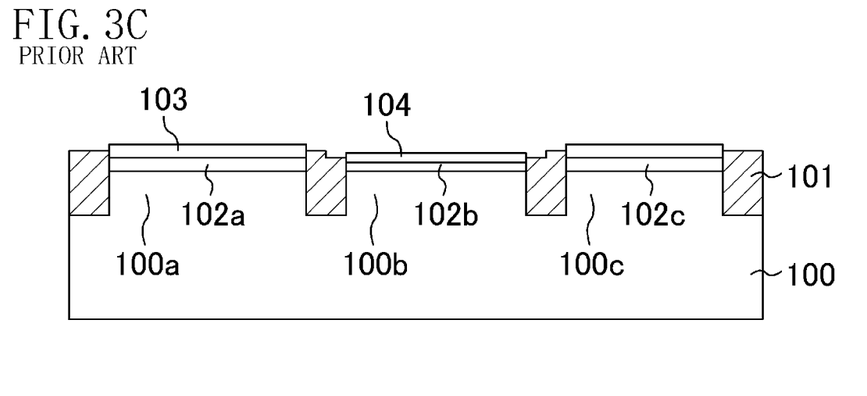

Then, as shown in FIG. 3C, second thermal oxidation for forming a gate insulating film is performed to provide on the second active region 100b, a second film 104 for forming a silicon oxide film having a smaller thickness than the first film 103 for forming a silicon oxide film.

Figure 4A:
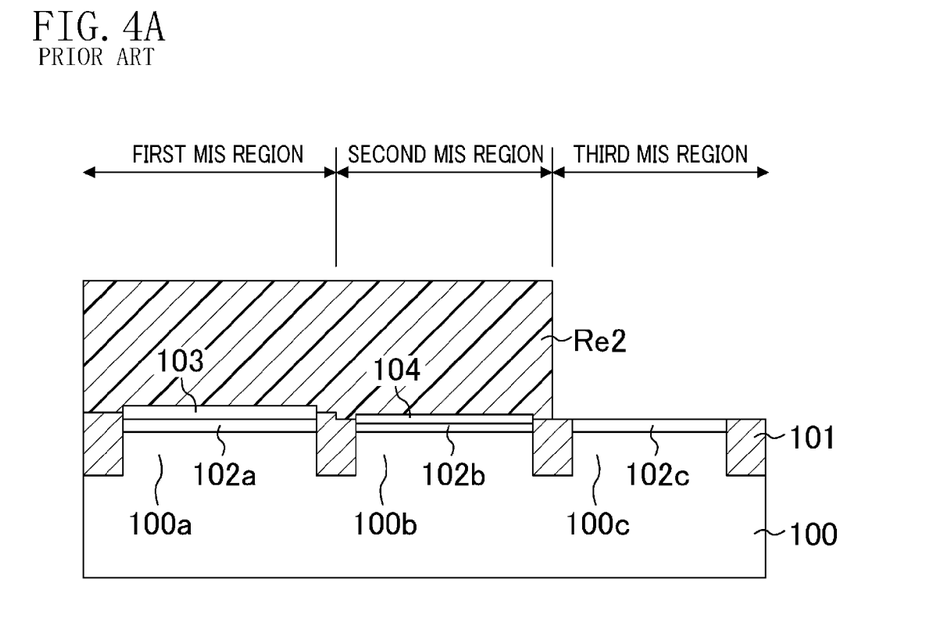
FIGS. 4A and 4B are cross-sectional illustrating main steps of the manufacturing method of the conventional semiconductor device in the gate length direction in order of the steps.

After that, as shown in FIG. 4A, a resist pattern Re2, which covers the first and second MIS regions and exposes the third MIS region, is formed on the first and second films 103 and 104 for forming silicon oxide films. Then, the portion of the first film 103 for forming a silicon oxide film, which is formed in the third MIS region, is removed by etching using the resist pattern Re2 as a mask. This exposes a surface of the third active region 100c. Then, the resist pattern Re2 is removed.

Figure 4B:
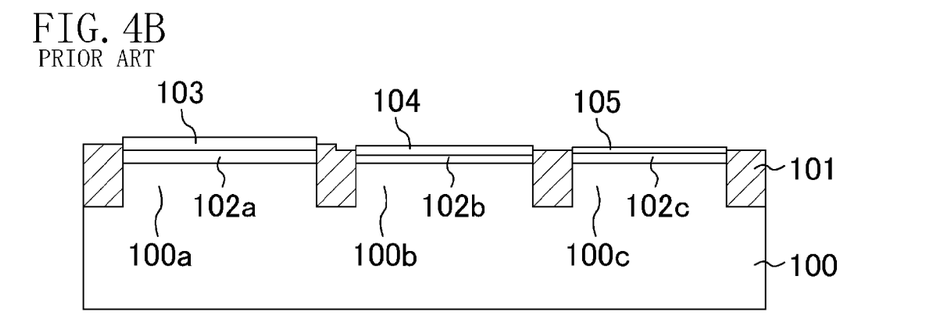

Next, as shown in FIG. 4B, third thermal oxidation for forming a gate insulating film is performed to provide on the third active region 100c, a third film 105 for forming a silicon oxide film having a smaller thickness than the second film 104 for forming a silicon oxide film.

Then, although not shown in the figure, a film for forming a gate electrode is formed on the first, second, and third films 103, 104, and 105 for forming silicon oxide films. After that, the film for forming a gate electrode, as well as the first, second, and third films 103, 104, and 105 for forming silicon oxide films are sequentially patterned. As a result, a first gate insulating film (not shown), which is the first film for forming a silicon oxide film, and a first gate electrode (not shown) formed of the film for forming a gate electrode are sequentially provided on the first active region 100a. A second gate insulating film (not shown), which is the second film for forming a silicon oxide film, and a second gate electrode (not shown) formed of the film for forming a gate electrode are sequentially provided on the second active region 100b. A third gate insulating film (not shown), which is the third film for forming a silicon oxide film, and a third gate electrode (not shown) formed of the film for forming a gate electrode are sequentially provided on the third active region 100c. At this time, as described above, the second film 104 for forming a silicon oxide film has a thickness smaller than the thickness of the first film 103 for forming a silicon oxide film, and greater than the thickness of the third film 105 for forming a silicon oxide film. Thus, the second gate insulating film has a thickness smaller than the thickness of the first gate insulating film and greater than the third gate insulating film.

As described above, the conventional semiconductor device is manufactured.

SUMMARY

However, the conventional semiconductor device has the following problems.

As shown in FIG. 3A, in the manufacturing method of the conventional semiconductor device, first thermal oxidation is performed to provide the first film 103 for forming a silicon oxide film after forming the first, second, and third channel diffusion layers 102a, 102b, and 102c. Then, as shown in FIG. 3C, second thermal oxidation is performed to provide the second film 104 for forming a silicon oxide film. After that, as shown in FIG. 4B, third thermal oxidation is performed to provide the third film 105 for forming a silicon oxide film. As such, the three thermal oxidation processes are performed after forming the first, second, and third channel diffusion layers 102a, 102b, and 102c. Thus, conductive impurities contained in the first, second, and third channel diffusion layers 102a, 102b, and 102c are diffused in each of the three thermal oxidation processes, thereby fluctuating impurity profiles of the first, second, and third channel diffusion layers 102a, 102b, and 102c.

In particular, the amount of the diffused conductive impurities contained in the first, second, and third channel diffusion layers 102a, 102b, and 102c is the largest in the first thermal oxidation, and gradually decreases in the second thermal oxidation and the third thermal oxidation. The reasons are as follows. In general, time for thermal oxidation in formation of a thick oxide film needs to be longer than that in formation of a thin oxide film, or oxidation temperature in formation of a thick oxide film needs to be higher than that in formation of a thin oxide film. In this case, conductive impurities contained in a channel diffusion layer are easily diffused, as compared to the case where the time for the thermal oxidation is short, or where the oxidation temperature is low. Since the first film 103 for forming a silicon oxide film has a greater thickness than the second film 104 for forming a silicon oxide film, the first thermal oxidation requires a longer time period than the second thermal oxidation. Also, since the second film 104 for forming a silicon oxide film has a greater thickness than the third film 105 for forming a silicon oxide film, the second thermal oxidation requires a longer time period than the third thermal oxidation. Therefore, the required time period is the longest in the first thermal oxidation, and gradually decreases in the second thermal oxidation and the third thermal oxidation.

As shown in FIG. 3A, the oxidized portions of the first, second, and third active regions 100a, 100b, and 100c are consumed as the first film for forming a silicon oxide film. Thus, the upper portions of the first, second, and third channel diffusion layers 102a, 102b, and 102c are consumed as the first film for forming a silicon oxide film. Then, as shown in FIG. 3B, the portion of the first film 103 for forming a silicon oxide film, which is formed in the second MIS region, is removed. Thus, the portion of the second channel diffusion layer 102b, which is consumed as the first film for forming a silicon oxide film, is removed. After that, as shown in FIG. 3C, the oxidized portion of the second active region 100b is consumed as the second film for forming a silicon oxide film. Thus, the upper portion of the second channel diffusion layer 102b is consumed as the second film for forming a silicon oxide film. Then, as shown in FIG. 4A, the portion of the first film 103 for forming a silicon oxide film, which is formed in the third MIS region, is removed. Thus, the portion of the third channel diffusion layer 102c, which is consumed as the first film for forming a silicon oxide film, is removed. After that, as shown in FIG. 4B, the oxidized portion of the third active region 100c is consumed as the third film for forming a silicon oxide film. Thus, the upper portion of the third channel diffusion layer 102c is consumed as the third film for forming a silicon oxide film. Therefore, the first, second, and third channel diffusion layers 102a, 102b, and 102c have lower surfaces than the first, second, and third channel diffusion layers 102a, 102b, and 102c immediately after the formation. (In other words, the first, second, and third channel diffusion layers 102a, 102b, and 102c have shallower depths than the first, second, and third channel diffusion layers 102a, 102b, and 102c immediately after the formation.) This causes the problem of fluctuations in the impurity profiles of the first, second, and third channel diffusion layers 102a, 102b, and 102c.

As described above, the impurity profiles of the first, second, and third channel diffusion layers 102a, 102b, and 102c fluctuate in each of the three thermal oxidation processes. Also, the consumption of the upper portions as the film for forming a silicon oxide film causes the fluctuations in the impurity profiles of the first, second, and third channel diffusion layers 102a, 102b, and 102c. Therefore, first, second, and third MIS transistors with desired characteristics cannot be provided.

In view of the problem, it is an objective of the present disclosure to reduce fluctuations in impurity profiles of a first, second, and third channel diffusion layers in a semiconductor device including a first, second, and third MIS transistors having different operating voltages.

In order to achieve the objective, a semiconductor device according to an aspect of the present disclosure includes a first MIS transistor of a first conductivity type including a first gate electrode formed on a first active region of a semiconductor substrate with a first gate insulating film interposed therebetween; a second MIS transistor of the first conductivity type including a second gate electrode which is formed on a second active region of the semiconductor substrate with a second gate insulating film interposed therebetween, and has a shorter gate length than the first gate electrode; and a third MIS transistor of the first conductivity type including a third gate electrode which is formed on a third active region of the semiconductor substrate with a third gate insulating film interposed therebetween, and has a shorter gate length than the second gate electrode. The first gate insulating film is formed of a first silicon oxide film and a first high-k insulating film provided on the first silicon oxide film. The second gate insulating film is formed of a second silicon oxide film and a second high-k insulating film provided on the second silicon oxide film. The third gate insulating film is formed of a third silicon oxide film and a third high-k insulating film provided on the third silicon oxide film. The second silicon oxide film has a same thickness as the first silicon oxide film and a greater thickness than the third silicon oxide film. The semiconductor device preferably further includes: a first channel diffusion layer of a second conductivity type formed in the first active region under the first gate insulating film; a second channel diffusion layer of the second conductivity type formed in the second active region under the second gate insulating film; and a third channel diffusion layer of the second conductivity type formed in the third active region under the third gate insulating film. The second channel diffusion layer preferably has an impurity concentration higher than the impurity concentration of the first channel diffusion layer, and lower than the impurity concentration of the third channel diffusion layer.

In the semiconductor device according to the aspect of the present disclosure, the first gate insulating film has the multilayer structure of the first silicon oxide film and the first high-k insulating film, and the second gate insulating film has the multilayer structure of the second silicon oxide film and the second high-k insulating film. As a result, the first silicon oxide film has a same thickness as the second silicon oxide film. The number of heat treatment processes after forming the first, second, and third channel diffusion layers is two of: heat treatment for forming the first and second silicon oxide films, and heat treatment for forming the third silicon oxide film. The number can be reduced as compared to a conventional device. This reduces the number of times that impurities of the second conductivity type contained in the first, second, and third channel diffusion layers are diffused. As a result, fluctuations in impurity profiles of the first, second, and third channel diffusion layers can be reduced.

In addition, the first, second, and third gate insulating films have the multilayer structures of the first, second, and third silicon oxide films; and the first, second, and third high-k insulating films, respectively. This reduces the thicknesses of the first, second, and third silicon oxide films as compared to a conventional device. This leads to shortening of the time needed for the heat treatment for forming the first and second silicon oxide films, and the time needed for the heat treatment for forming the third silicon oxide film. Thus, in each of the two heat treatment processes, the amount of the diffused impurities of the second conductivity type contained in the first, second, and third channel diffusion layers can be reduced. As a result, fluctuations in the impurity profiles of the first, second, and third channel diffusion layers are reduced.

Furthermore, as described above, the thicknesses of the first, second, and third silicon oxide films can be reduced as compared to a conventional device. Then, the amount of the first, second, and third channel diffusion layers, which is consumed as a silicon oxide film can be reduced in the heat treatment for forming the first and second silicon oxide films. The amount of the third channel diffusion layer, which is consumed as a silicon oxide film can be also reduced in the heat treatment for forming the third silicon oxide film. This mitigates reduction in the heights of the surfaces of the first, second, and third channel diffusion layers as compared to the first, second, and third channel diffusion layers immediately after the formation. As a result, fluctuations in the impurity profiles of the first, second, and third channel diffusion layers are reduced.

As such, reduction in the number of the heat treatment processes, and shortening of the time for the heat treatment due to the reduction in the thicknesses of the silicon oxide films effectively reduce fluctuations in the impurity profiles of the first, second, and third channel diffusion layers. Therefore, the first, second, and third MIS transistors with desired characteristics can be provided.

In the semiconductor device according to the aspect of the present disclosure, the second MIS transistor preferably has an operating voltage lower than the operating voltage of the first MIS transistor, and higher than the operating voltage of the third MIS transistor.

In the semiconductor device according to the aspect of the present disclosure, the first high-k insulating film, the second high-k insulating film, and the third high-k insulating film preferably have a same thickness.

In the semiconductor device according to the aspect of the present disclosure, the first gate electrode is preferably formed of a first metal film and a first silicon film provided on the first metal film. The second gate electrode is preferably formed of a second metal film and a second silicon film provided on the second metal film. The third gate electrode is preferably formed of a third metal film and a third silicon film provided on the third metal film.

The semiconductor device according to the aspect of the present disclosure preferably further includes: a first extension region of the first conductivity type formed in the first active region below a side of the first gate electrode; a second extension region of the first conductivity type formed in the second active region below a side of the second gate electrode; and a third extension region of the first conductivity type formed in the third active region below a side of the third gate electrode. The second extension region has an impurity concentration equal to or higher than an impurity concentration of the first extension region, and lower than an impurity concentration of the third extension region.

As such, since the first and second extension regions have low impurity concentrations, the occurrence of excess hot electrons in the first and second MIS transistors with high operating voltages is reduced. This prevents the excess hot electrons from entering the first and second gate insulating films to change the threshold voltages of the first and second MIS transistors, thereby mitigating reduction in the reliability of the first and second MIS transistors.

On the other hand, since the third extension region has a high impurity concentration, the drive capability of the third MIS transistor with a low operating voltage can be improved.

In the semiconductor device according to the aspect of the present disclosure, each of the first high-k insulating film, the second high-k insulating film, and the third high-k insulating film is preferably made of a metal oxide having a relative dielectric constant of 10 or more.

In the semiconductor device according to the aspect of the present disclosure, each of the first silicon oxide film and the second silicon oxide film preferably has a thickness ranging from 3 nm to 6 nm. The third silicon oxide film preferably has a thickness ranging from 0.8 nm to 1.2 nm.

In order to achieve the objective, a manufacturing method of a semiconductor device according to an aspect of the present disclosure includes the steps of: (a) forming a first film for forming a silicon oxide film, on a first active region of a semiconductor substrate, and forming the first film for forming a silicon oxide film, on a second active region of the semiconductor substrate; (b) after the step (a), forming a second film for forming a silicon oxide film, which has a smaller thickness than the first film for forming a silicon oxide film, on a third active region of the semiconductor substrate; (c) providing a film for forming a high-k insulating film, on the first film for forming a silicon oxide film and the second film for forming a silicon oxide film; (d) providing a film for forming a gate electrode, on the film for forming a high-k insulating film; and (e) sequentially patterning the film for forming a gate electrode, the film for forming a high-k insulating film, the first film for forming a silicon oxide film, and the second film for forming a silicon oxide film to form on the first active region, a first gate electrode formed of the film for forming a gate electrode, and a first gate insulating film including a first silicon oxide film, which is the first film for forming a silicon oxide film, and a first high-k insulating film, which is the film for forming a high-k insulating film; to form on the second active region, a second gate electrode formed of the film for forming a gate electrode, and a second gate insulating film including a second silicon oxide film, which is the first film for forming a silicon oxide film, and a second high-k insulating film, which is the film for forming a high-k insulating film; and to form on the third active region, a third gate electrode formed of the film for forming a gate electrode, and a third gate insulating film including a third silicon oxide film, which is the second film for forming a silicon oxide film, and a third high-k insulating film, which is the film for forming a high-k insulating film. The second gate electrode has a gate length shorter than a gate length of the first gate electrode, and greater than a gate length of the third gate electrode. The method further includes the steps of: (f) before the step (a), forming a first channel diffusion layer of a second conductivity type in an upper region of the first active region by first ion implantation; (g) before the step (a), forming a second channel diffusion layer of the second conductivity type in an upper region of the second active region by second ion implantation; and (h) before the step (a), forming a third channel diffusion layer of the second conductivity type in an upper region of the third active region by a third ion implantation. The does in the second ion implantation is preferably higher than that in the first ion implantation, and lower than that in the third ion implantation.

In the manufacturing method of the semiconductor device according to the aspect of the present disclosure, the first gate insulating film has the multilayer structure of the first silicon oxide film and the first high-k insulating film, and the second gate insulating film has the multilayer structure of the second silicon oxide film and the second high-k insulating film. As a result, the first silicon oxide film has the same thickness as the second silicon oxide film. Thus, the number of heat treatment processes performed after forming the first, second, and third channel diffusion layers is two of: heat treatment for forming the first and second silicon oxide films (i.e., heat treatment for forming the first film for forming a silicon oxide film), and heat treatment for forming the third silicon oxide film (i.e., heat treatment for forming the second film for forming a silicon oxide film). The number can be reduced as compared to a conventional device. This reduces the number of times that impurities of the second conductivity type contained in the first, second, and third channel diffusion layers are diffused. As a result, fluctuations in impurity profiles of the first, second, and third channel diffusion layers can be reduced.

In addition, the first, second, and third gate insulating films have the multilayer structures of the first, second, and third silicon oxide films; and the first, second, and third high-k insulating films, respectively. This reduces the thicknesses of the first, second, and third silicon oxide films as compared to a conventional device, thereby reducing the first and second films for forming silicon oxide films. This leads to shortening of the time needed for the heat treatment for forming the first film for forming a silicon oxide film, and the time needed for the heat treatment for forming the second film for forming a silicon oxide film. Thus, in each of the two heat treatment processes, the amount of the diffused impurities of the second conductivity type contained in the first, second, and third channel diffusion layers can be reduced. As a result, fluctuations in the impurity profiles of the first, second, and third channel diffusion layers are reduced.

Furthermore, as described above, since the thicknesses of the first, second, and third silicon oxide films can be reduced as compared to a conventional device, the thicknesses of the first and second films for forming silicon oxide films can be reduced. Then, the amount of the first, second, and third channel diffusion layers, which is consumed as the first film for forming a silicon oxide film, can be reduced in the heat treatment for forming the first film for forming a silicon oxide film. The amount of the third channel diffusion layer, which is consumed as the second film for forming a silicon oxide film, can be also reduced in the heat treatment for forming the second film for forming a silicon oxide film. This mitigates reduction in the heights of the surfaces of the first, second, and third channel diffusion layers as compared to the first, second, and third channel diffusion layers immediately after the formation. As a result, fluctuations in the impurity profiles of the first, second, and third channel diffusion layers are reduced.

As such, reduction in the number of the heat treatment processes, and shortening of the time for the heat treatment due to the reduction in the thicknesses of the films for forming silicon oxide films effectively reduce fluctuations in the impurity profiles of the first, second, and third channel diffusion layers. Therefore, the first, second, and third MIS transistors with desired characteristics can be provided.

In the manufacturing method of the semiconductor device according to the aspect of the present disclosure, the step (d) is preferably a step of providing the film for forming a gate electrode which is produced by sequentially laminating a film for forming a metal film and a film for forming a silicon film, on the film for forming a high-k insulating film. The step (e) is preferably a step of sequentially patterning the film for forming a silicon film, the film for forming a metal film, the film for forming a high-k insulating film, the first film for forming a silicon oxide film, and the second film for forming a silicon oxide film to form on the first active region, the first gate insulating film, and the first gate electrode formed of a first metal film, which is the film for forming a metal film, and a first silicon film, which is the film for forming a silicon film; to form on the second active region, the second gate insulating film, and the second gate electrode formed of a second metal film, which is the film for forming a metal film, and a second silicon film, which is the film for forming a silicon film; and to form on the third active region, the third gate insulating film, and the third gate electrode formed of a third metal film, which is the film for forming a metal film, and a third silicon film, which is the film for forming a silicon film.

The manufacturing method of the semiconductor device according to the aspect of the present disclosure, further includes the steps of: (i) after the step (e), forming a first extension region of the first conductivity type in the first active region below a side of the first gate electrode by fourth ion implantation; (j) after the step (e), forming a second extension region of the first conductivity type in the second active region below a side of the second gate electrode by fifth ion implantation; and (k) after the step (e), forming a third extension region of the first conductivity type in the third active region below a side of the third gate electrode by sixth ion implantation. A dose in the fifth ion implantation is preferably equal to or higher than a dose in the fourth ion implantation, and lower than a dose in the sixth ion implantation.

As a result, the second extension region has an impurity concentration equal to or higher than the impurity concentration of the first extension region, and lower than the impurity concentration of the third extension region.

Thus, occurrence of excess hot electrons in the first and second MIS transistors with high operating voltages can be reduced. This prevents the excess hot electrons from entering the first and second gate insulating films to change the threshold voltages of the first and second MIS transistors, thereby mitigating reduction in the reliability of the first and second MIS transistors.

On the other hand, the drive capability of the third MIS transistor with a low operating voltage can be improved.

As described above, in the semiconductor device and the manufacturing method of the device according to the aspect of the present disclosure, reduction in the number of the heat treatment processes, and shortening of the time for the heat treatment due to the reduction in the thicknesses of the silicon oxide films effectively mitigates reduction in fluctuations in the impurity profiles of the first, second, and third channel diffusion layers. Therefore, the first, second, and third MIS transistors with desired characteristics can be provided.

DETAILED DESCRIPTION

An embodiment of the present disclosure will be described hereinafter with reference to the drawings.

Embodiment

A manufacturing method of a semiconductor device according to the embodiment of the present disclosure will be described below with reference to FIGS. 1A-1C and FIGS. 2A-2C. FIGS. 1A-2C are cross-sectional illustrating main steps of the manufacturing method of the semiconductor device according to the embodiment of the present disclosure in a gate length direction in order of steps. In FIGS. 1A-2C, a "first MIS region" on the left side denotes a region on which a first MIS transistor is formed, a "second MIS region" in the middle denotes a region on which a second MIS transistor is formed, and a "third MIS region" on the right side denotes a region on which a third MIS transistor is formed. An operating voltage Vdd2 of the second MIS transistor is lower than an operating voltage Vdd1 of the first MIS transistor, and higher than an operating voltage Vdd3 of the third MIS transistor (Vdd1>Vdd2>Vdd3). The first and second MIS transistors may be, for example, input/output (I/O) MIS transistors. The third MIS transistor may be, for example, a MIS transistor for an internal circuit.

Figure 1A:
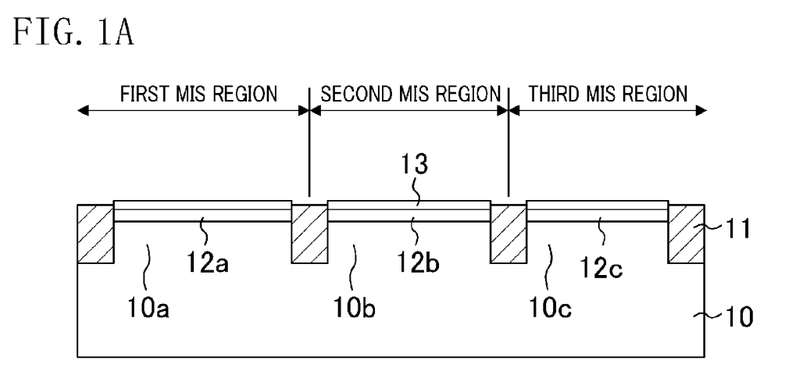
FIGS. 1A-1C are cross-sectional illustrating main steps of a manufacturing method of a semiconductor device according to an embodiment of the present disclosure in a gate length direction in order of the steps.

First, as shown in FIG. 1A, an isolation region 11, which is formed by filling a trench with an insulating film, is selectively provided in an upper portion of a semiconductor substrate 10 made of, for example, silicon by, for example, shallow trench isolation (STI). As a result, a first, second, and third active regions 10a, 10b, and 10c, which are surrounded by the isolation region 11, are formed in the first, second, and third MIS regions of the semiconductor substrate 10, respectively. After implanting p-type impurities such as boron (B) into the first, second, and third MIS regions of the semiconductor substrate 10 by ion implantation, the semiconductor substrate 10 is subject to heat treatment. As a result, a first, second and third p-type well regions (not shown) are formed in the first, second, and third MIS regions of the semiconductor substrate 10.

Then, p-type impurities such as boron (B) are implanted into the first active region 10a by first Vt implantation (first ion implantation) under the conditions that, for example, energy ranges from 10 keV to 15 keV, and a dose ranges from $3\times10^{12}/cm^2$ to $1\times10^{13}/cm^2$. As a result, a first p-type channel diffusion layer 12a is formed in an upper portion of the first active region 10a. After that, p-type impurities such as B are implanted into the second active region 10b by second Vt implantation (second ion implantation) under the conditions that, for example, energy ranges from 10 keV to 15 keV, and a dose ranges from $5\times10^{12}/cm^2$ to $2\times10^{13}/cm^2$. As a result, a second p-type channel diffusion layer 12b is formed in an upper portion of the second active region 10b. Then, p-type impurities such as B are implanted into the third active region 10c by third Vt implantation (third ion implantation) under the conditions that, for example, energy ranges from 5 keV to 10 keV, and a dose ranges from $6\times10^{12}/cm^2$ to $3\times10^{13}/cm^2$. As a result, a third p-type channel diffusion layer 12c is formed in an upper portion of the third active region 10c. In this embodiment, the "first Vt implantation," "second Vt implantation," and "third Vt implantation" denote ion implantation for forming the first, second, and third channel diffusion layers, respectively. The order of performing the first, second, and third Vt implantation is not limited thereto and may be any order.

The quantitative relationship among doses in the first, second, and third Vt implantation are as follows. A dose Dvt2 in the second Vt implantation is higher than a dose Dvt1 in the first Vt implantation, and lower than a dose Dvt3 in the third Vt implantation (Dvt1<Dvt2<Dvt3).

As such, in order to allow the doses to satisfy the relationship of Dvt1<Dvt2<Dvt3, the second channel diffusion layer 12b has an impurity concentration higher than the impurity concentration of the first channel diffusion layer 12a, and lower than the impurity concentration of the third channel diffusion layer 12c.

Then, a first film 13 for forming a silicon oxide film, which is a silicon oxide film with a thickness of, for example, 3.3 nm, is formed on the first, second, and third active regions 10a, 10b, and 10c by, for example, wet oxidation at a temperature of, for example, 900° C. The first film 13 for forming a silicon oxide film preferably has a thickness ranging from 3 nm to 6 nm, for example.

Figure 1B:
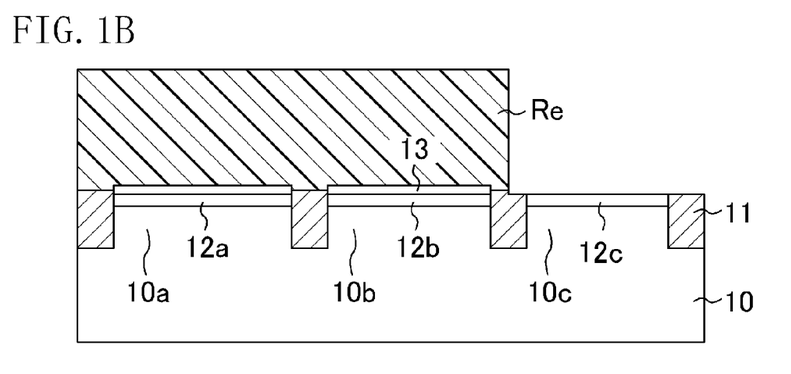

Next, as shown in FIG. 1B, a resist pattern Re, which covers the first and second MIS regions and exposes the third MIS region, is formed on the first film 13 for forming a silicon oxide film by lithography. Then, the portion of the first film 13 for forming a silicon oxide film, which is formed in the third MIS region, is removed using the resist pattern Re as a mask to expose a surface of the third active region 10c. Then, the resist pattern Re is removed.

As such, the first film 13 for forming a silicon oxide film is formed on the first and second active regions 10a and 10b.

Figure 1C:
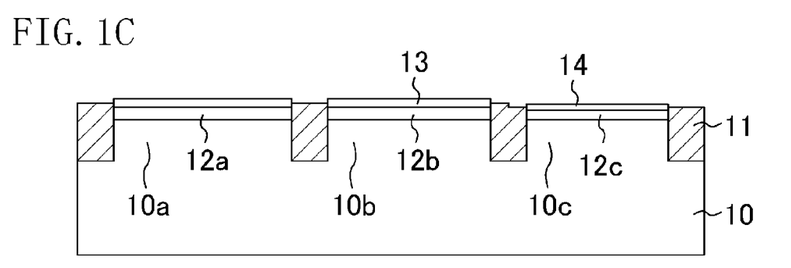

After that, as shown in FIG. 1C, a second film 14 for forming a silicon oxide film, which is a silicon oxide film with a thickness of, for example, 1.0 nm, is formed on the third active region 10c by, for example, in-situ steam generation (ISSG) at a temperature of, for example, 900° C. The second film 14 for forming a silicon oxide film preferably has a thickness ranging from 0.8 nm to 1.2 nm, for example.

Figure 2A:
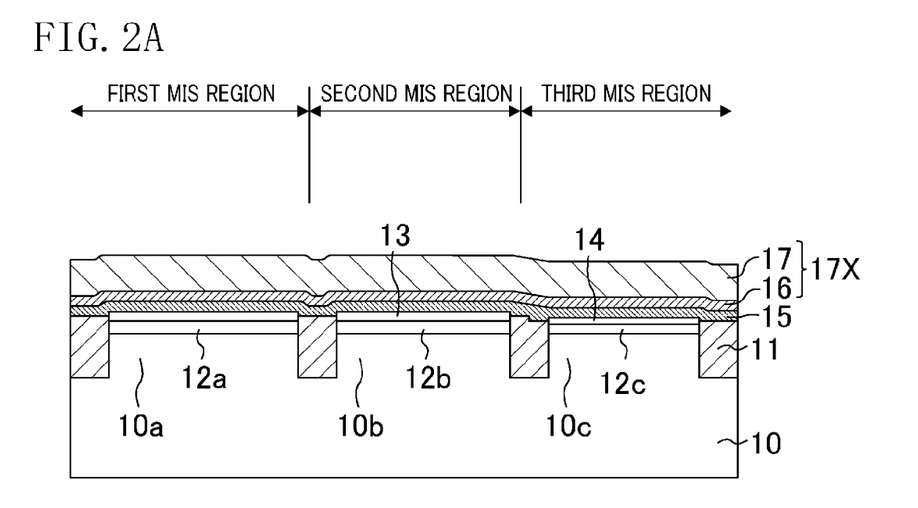
FIGS. 2A-2C are cross-sectional illustrating main steps of the manufacturing method of the semiconductor device according to the embodiment of the present disclosure in the gate length direction in order of the steps.

Then, as shown in FIG. 2A, a film 15 for forming a high-k insulating film, which has a thickness of, for example, 2.5 nm and made of $HfO_2$ or HfSiON, is formed on the first film 13 for forming a silicon oxide film and the second film 14 for forming a silicon oxide film by, for example, metal organic chemical vapor deposition (MOCVD), atomic layer deposition (ALD), or the like. The film 15 for forming a high-k insulating film is preferably made of a metal oxide having a relative dielectric constant of, for example, 10 or more.

After that, a film 16 for forming a metal film, which has a thickness ranging, for example, from 10 nm to 15 nm and made of titanium nitride (TiN), is formed on the film 15 for forming a high-k insulating film by, for example, chemical vapor deposition (CVD), ALD, sputtering, or the like.

Next, a film 17 for forming a silicon film, which is a polysilicon film with a thickness ranging, for example, from 30 nm to 100 nm, is formed on the film 16 for forming a metal film by, for example, CVD.

As such, a film 17X for forming a gate electrode, which is formed of the film 16 for forming a metal film and the film 17 for forming a silicon film, is provided on the film 15 for forming a high-k insulating film.

Figure 2B:
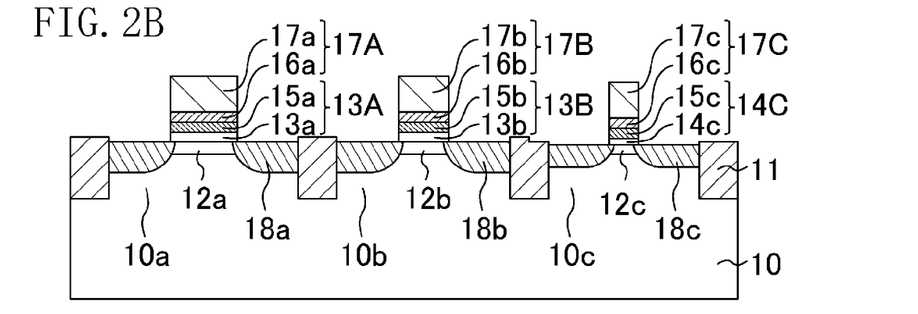

Then, as shown in FIG. 2B, a resist pattern (not shown) having a first, second, and third gate pattern forms is formed on the film 17 for forming a silicon film by photolithography. At this time, the resist pattern is formed so that a width W2 of the second gate pattern form in the gate length direction is narrower than a width W1 of the first gate pattern form in the gate length direction, and greater than a width W3 of the third gate pattern form in the gate length direction (W1>W2>W3).

After that, the film 17 for forming a silicon film, the film 16 for forming a metal film, and the film 15 for forming a high-k insulating film, as well as the first film 13 for forming a silicon oxide film, and the second film 14 for forming a silicon oxide film are sequentially patterned by etching, using the resist pattern as a mask. As a result, a first silicon oxide film 13a, a first high-k insulating film 15a, a first metal film 16a, and a first silicon film 17a are sequentially formed on the first active region 10a. A second silicon oxide film 13b, a second high-k insulating film 15b, a second metal film 16b, and a second silicon film 17b are sequentially formed on the second active region 10b. A third silicon oxide film 14c, a third high-k insulating film 15c, a third metal film 16c, and a third silicon film 17c are sequentially formed on the third active region 10c. Then, the resist pattern is removed.

As such, a first gate insulating film 13A formed of the first silicon oxide film 13a and the first high-k insulating film 15a, and a first gate electrode 17A formed of the first metal film 16a and the first silicon film 17a are provided on the first active region 10a. Also, a second gate insulating film 13B formed of the second silicon oxide film 13b and the second high-k insulating film 15b, and a second gate electrode 17B formed of the second metal film 16b and the second silicon film 17b are provided on the second active region 10b. A third gate insulating film 14C formed of the third silicon oxide film 14c and the third high-k insulating film 15c, and a third gate electrode 17C formed of the third metal film 16c and the third silicon film 17c are provided on the third active region 10c.

In this embodiment, as described above, the widths of the first, second, and third gate pattern forms in the gate length direction satisfy the relationship of W1>W2>W3. Thus, a gate length Lg2 of the second gate electrode 17B is shorter than a gate length Lg1 of the first gate electrode 17A, and greater than a gate length Lg3 of the third gate electrode 17C (Lg1>Lg2>Lg3). Specifically, for example, the gate length Lg1 is 250 nm, the gate length Lg2 is 150 nm, and the gate length Lg3 is 30 nm.

Next, n-type impurities such as arsenic (As) are implanted into the first active region 10a by first Ex implantation (fourth ion implantation) using the first gate electrode 17A as a mask under the conditions that, for example, energy ranges from 20 keV to 45 keV, and a dose ranges from $3 \times 10^{13}/cm^2$ to $3 \times 10^{14}/cm^2$. As a result, a first n-type extension region 18a is formed in the first active region 10a below a side of the first gate electrode 17A in a self-aligned manner. Then, n-type impurities such as As are implanted into the second active region 10b by second Ex implantation (fifth ion implantation) using the second gate electrode 17B as a mask under the conditions that, for example, energy ranges from 10 keV to 30 keV, and a dose ranges from $3 \times 10^{13}/cm^2$ to $3 \times 10^{14}/cm^2$. As a result, a second n-type extension region 18b is formed in the second active region 10b below a side of the second gate electrode 17B in a self-aligned manner. After that, n-type impurities such as As are implanted into the third active region 10c by third Ex implantation (sixth ion implantation) using the third gate electrode 17C as a mask under the conditions that, for example, energy ranges from 1 keV to 3 keV, and a dose ranges from $5 \times 10^{14}/cm^2$ to $3 \times 10^{15}/cm^2$. As a result, a third n-type extension region 18c is formed in the third active region 10c below a side of the third gate electrode 17C in a self-aligned manner. In this embodiment, the "first Ex implantation," "second Ex implantation," and "third Ex implantation" denote ion implantation for forming the first, second, and third extension regions, respectively. The order of performing the first, second, and third Ex implantation is not limited thereto, and may be in any order.

The magnitude relationship among the energy in the first, second, and third Ex implantation is as follows. Energy Eex2 in the second Ex implantation is smaller than energy Eex1 in the first Ex implantation, and greater than energy Eex3 in the third Ex implantation (Eex1>Eex2>Eex3).

As such, since the energy satisfies the relationship of Eex1>Eex2>Eex3, a depth of the second extension region 18b is shallower than a depth of the first extension region 18a, and greater than a depth of the third extension region 18c.

The quantitative relationship among the doses in the first, second, and third Ex implantation is as follows. A dose Dex2 in the second Ex implantation is equal to or higher than a dose Dex1 in the first Ex implantation, and lower than a dose Dex3 in the third Ex implantation (Dex1≤Dex2<Dex3).

As such, since the doses satisfy the relationship of Dex1≤Dex2<Dex3, the second extension region 18b has an impurity concentration equal to or higher than the impurity concentration of the first extension region 18a, and lower than the impurity concentration of the third extension region 18c.

Figure 2C:
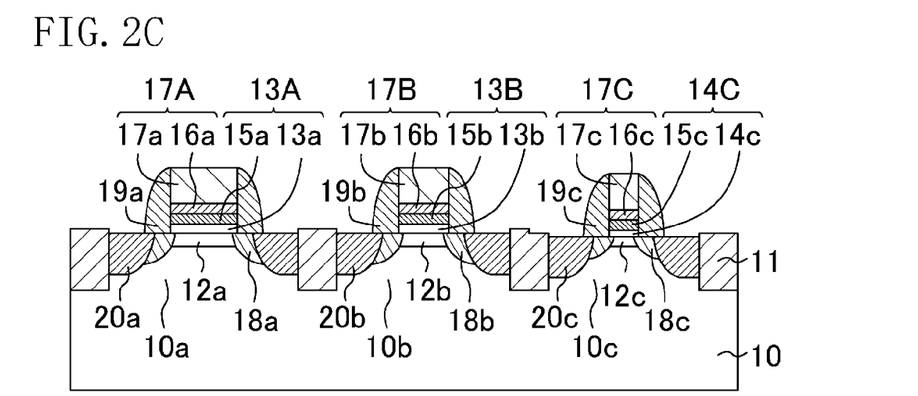

Next, as shown in FIG. 2C, an insulating film for sidewalls, which is, for example, a silicon oxide film with a thickness ranging from 30 nm to 40 nm, is formed on the entire surface of the semiconductor substrate 10 by, for example, CVD. Then, the insulating film for sidewalls is anisotropically etched. As a result, first, second, and third sidewalls 19a, 19b, and 19c are formed on side surfaces of the first, second, and third gate electrodes 17A, 17B, and 17C, respectively.

After that, n-type impurities such as As are implanted into the first, second, and third active regions 10a, 10b, and 10c under the conditions that, for example, energy ranges from 10 keV to 20 keV, and a dose ranges from $1 \times 10^{15}/cm^2$ to $7 \times 10^{15}/cm^2$ by S/D implantation using the first, second, and third gate electrodes 17A, 17B, and 17C as well as the first, second, and third sidewalls 19a, 19b, and 19c as a mask. As a result, first, second, and third n-type source/drain regions 20a, 20b, and 20c are formed in the first, second, and third active regions 10a, 10b, and 10c below outer sides of the first, second, and third sidewalls 19a, 19b, and 19c, respectively, in a self-aligned manner. In this embodiment, the "S/D implantation" denotes ion implantation for forming the first, second, and third source/drain regions. Then, n-type impurities contained in the first, second, and third source/drain regions 20a, 20b, and 20c are activated by heat treatment.

As described above, the semiconductor device according to this embodiment, i.e., the semiconductor device including the first n-type MIS transistor Tr1 having an operating voltage of, e.g., 2.5 V, the second n-type MIS transistor Tr2 having an operating voltage of, e.g., 1.8 V, and the third n-type MIS transistor Tr3 having an operating voltage of, e.g., 1.0 V can be manufactured.

The structure of the semiconductor device according to an embodiment of the present disclosure will be described below with reference to FIG. 2C.

As shown in FIG. 2C, the first n-type MIS transistor Tr1 is provided on the first MIS region of the semiconductor substrate 10. The second n-type MIS transistor Tr2 is provided on the second MIS region of the semiconductor substrate 10. The third n-type MIS transistor Tr3 is provided on the third MIS region of the semiconductor substrate 10.

The operating voltage Vdd2 of the second MIS transistor Tr2 is lower than the operating voltage Vdd1 of the first MIS transistor Tr1, and higher than the operating voltage Vdd3 of the third MIS transistor Tr3 (Vdd1>Vdd2>Vdd3).

As shown in FIG. 2C, the first MIS transistor Tr1 includes the first gate insulating film 13A provided on the first active region 10a and formed of the first silicon oxide film 13a and the first high-k insulating film 15a, the first gate electrode 17A provided on the first gate insulating film 13A and formed of the first metal film 16a and the first silicon film 17a, the first p-type channel diffusion layer 12a provided in the first active region 10a under the first gate insulating film 13A, the first n-type extension region 18a provided in the first active region 10a below the side of the first gate electrode 17A, the first sidewalls 19a provided on the side surfaces of the first gate electrode 17A, and the first n-type source/drain regions 20a provided in the first active region 10a below the outer sides of the first sidewalls 19a.

As shown in FIG. 2C, the second MIS transistor Tr2 includes the second gate insulating film 13B provided on the second active region 10b and formed of the second silicon oxide film 13b and the second high-k insulating film 15b, the second gate electrode 17B provided on the second gate insulating film 13B and formed of the second metal film 16b and the second silicon film 17b, the second p-type channel diffusion layer 12b provided in the second active region 10b under the second gate insulating film 13B, the second n-type extension region 18b provided in the second active region 10b below the side of the second gate electrode 17B, the second sidewalls 19b provided on the side surfaces of the second gate electrode 17B, and the second n-type source/drain regions 20b provided in the second active region 10b below the outer sides of the second sidewalls 19b.

As shown in FIG. 2C, the third MIS transistor Tr3 includes the third gate insulating film 14C provided on the third active region 10c and formed of the third silicon oxide film 14c and the third high-k insulating film 15c, the third gate electrode 17C provided on the third gate insulating film 14C and formed of the third metal film 16c and the third silicon film 17c, the third p-type channel diffusion layer 12c provided in the third active region 10c under the third gate insulating film 14C, the third n-type extension region 18c provided in the third active region 10c below the side of the third gate electrode 17C, the third sidewalls 19c provided on the side surfaces of the third gate electrode 17C, and the third n-type source/drain regions 20c provided in the third active region 10c below the outer sides of the third sidewalls 19c.

The second silicon oxide film 13b has a same thickness as the first silicon oxide film 13a, and a greater thickness than the third silicon oxide film 14c. The first and second silicon oxide films 13a and 13b preferably have a thickness ranging from 3 nm to 6 nm, for example. The third silicon oxide film 14c preferably has a thickness ranging from 0.8 nm to 1.2 nm, for example.

The first, second, and third high-k insulating films 15a, 15b, and 15c are made of a same material and have a same thickness.

Specifically, for example, when each of the first and second silicon oxide films 13a and 13b has a thickness of 3.3 nm, and each of the first and second high-k insulating films 15a and 15b has a thickness of 2.5 nm; each of the first and second gate insulating films 13A and 13B has a physical thickness of 5.8 nm, which is the sum of 3.3 nm and 2.5 nm, and an equivalent oxide thickness (EOT) of 3.5 nm. When the third silicon oxide film 14c has a thickness of 1.0 nm, and the third high-k insulating film 15c has a thickness of 2.5 nm; the third gate insulating film 14C has a physical thickness of 3.5 nm, which is the sum of 1.0 nm and 2.5 nm, and an EOT of 1.3 nm.

The gate length Lg2 of the second gate electrode 17B is shorter than the gate length Lg1 of the first gate electrode 17A, and greater than the gate length Lg3 of the third gate electrode 17C (Lg1>Lg2>Lg3).

The first, second, and third metal films 16a, 16b, and 16c are made of a same material and have a same thickness.

The first, second, and third silicon films 17a, 17b, and 17c are made of a same material and have a same thickness.

The second channel diffusion layer 12b has an impurity concentration higher than the impurity concentration of the first channel diffusion layer 12a, and lower than the impurity concentration of the third channel diffusion layer 12c.

The second extension region 18b has a depth shallower than the depth of the first extension region 18a, and greater than the depth of the third extension region 18c. The second extension region 18b has an impurity concentration equal to or higher than the impurity concentration of the first extension region 18a, and lower than the impurity concentration of the third extension region 18c.

By employing the following structures, the first, second, and third MIS transistors Tr1, Tr2, and Tr3 having different operating voltages Vdd1, Vdd2, and Vdd3 are provided.

First MIS Transistor Tr1

The first MIS transistor Tr1 structurally differs from the second MIS transistor Tr2 in the following points. The gate length Lg1 of the first gate electrode 17A is greater than the gate length Lg2 of the second gate electrode 17B (Lg1>Lg2).

Since the operating voltage Vdd1 applied to the first MIS transistor Tr1 is higher than the operating voltage Vdd2 applied to the second MIS transistor Tr2 (Vdd1>Vdd2), the gate length Lg1 of a first gate electrode 13A needs to be greater than the gate length Lg2 of a second gate electrode 13B (Lg1>Lg2). The reasons are as follows. When the gate length of the first gate electrode is short, hot carriers (carriers with great energy) occur and enter the first gate insulating film to change the threshold voltage of the first MIS transistor, thereby reducing the reliability of the first MIS transistor.

Therefore, the gate length Lg1 is set greater than the gate length Lg2 (Lg1>Lg2). As a result, the operating voltage Vdd1, which is higher than the operating voltage Vdd2 (Vdd1>Vdd2), is applied to the first MIS transistor Tr1 without reducing the reliability of the first MIS transistor Tr1.

In addition, since the operating voltage Vdd1 is the highest, the first gate insulating film 13A needs to have a great physical thickness not to cause breakage of the first gate insulating film 13A.

Therefore, the first gate insulating film 13A has the multilayer structure of the first silicon oxide film 13a and the first high-k insulating film 15a. This increases the physical thickness of the first gate insulating film 13A. Thus, since the breakdown voltage of the first gate insulating film 13A can be increased, breakage of the first gate insulating film 13A is reduced, even if the operating voltage Vdd1 is applied to the first MIS transistor Tr1.

Second MIS Transistor Tr2

The operating voltage Vdd2 is high, but lower than the operating voltage Vdd1. Thus, the second gate insulating film 13B needs to have a small EOT not to degrade drive capability of the second MIS transistor Tr2.

Therefore, the second gate insulating film 13B has the multilayer structure of the second silicon oxide film 13b and the second high-k insulating film 15b. This reduces the EOT of the second gate insulating film 13B. As a result, degradation in the drive capability of the second MIS transistor Tr2 is reduced.

Note that, in a conventional semiconductor device, when a first gate insulating film, which is a first silicon oxide film, has a same thickness as a second gate insulating film, which is a second silicon oxide film, and a first gate electrode has a greater gate length than a second gate electrode, the following problem occur.

First, for example, when each of the first and second gate insulating films has a thickness suited for a first MIS transistor (i.e., the thickness of the second gate insulating film is great and not suited for a second MIS transistor), the following problem occur.

When the second gate insulating film is thick (i.e., the second silicon oxide film is thick), the drive capability of the second MIS transistor degrades.

Therefore, when the first and second gate insulating films are the single layers of the first and second silicon oxide films, respectively, the second gate insulating film inevitably has a smaller thickness than the first gate insulating film, and the second gate insulating film cannot have a same thickness as the first gate insulating film.

Second, for example, when each of the first and second gate insulating films has a thickness suited for the second MIS transistor (i.e., the thickness of the first gate insulating film is small and not suited for the first MIS transistor), the following problem occur.

When the first gate insulating film is thin (i.e., the first silicon oxide film is thin), the breakdown voltage of the first gate insulating film is lowered to break the first gate insulating film.

Therefore, when the first and second gate insulating films are the single layers of the first and second silicon oxide films, respectively, the first gate insulating film inevitably has a greater thickness than the second gate insulating film, and the first gate insulating film cannot have a same thickness as the second gate insulating film.

Third MIS Transistor Tr3

Since the operating voltage Vdd3 is the lowest, the third gate insulating film 14C needs to have the smallest EOT not to degrade drive capability of the third MIS transistor Tr3. On the other hand, the third gate insulating film 14C needs to have a great physical thickness not to cause any leakage current due to reduction in the thickness of the third gate insulating film 14C. That is, the third gate insulating film 14C needs to have a small EOT, while requiring a great physical thickness.

Therefore, the third gate insulating film 14C is formed as the multilayer of the third silicon oxide film 14c, which is thinner than the first and second silicon oxide films 13a and 13b, and the third high-k insulating film 15c. This reduces the EOT of the third gate insulating film 14C, thereby reducing degradation in the drive capability of the third MIS transistor Tr3. At the same time, this also increases the physical thickness of the third gate insulating film 14C, thereby reducing occurrence of a leakage current.

First, Second, and Third Extension Regions

Each of the first and second extension regions 18a and 18b has a lower impurity concentration and a greater depth than the third extension region 18c.

If the impurity concentrations and the depths of the first and second extension regions are equal to the impurity concentration and the depth of the third extension region (i.e., if each of the first and second extension regions has a high impurity concentration and a shallow depth), the following problem occur. Since the operating voltages Vdd1 and Vdd2 are higher than the operating voltage Vdd3, excess hot electrons occur and enter the first and second gate insulating films to change the threshold voltages of the first and second MIS transistors, thereby reducing the reliability of the first and second MIS transistors.

Therefore, the impurity concentrations of the first and second extension regions 18a and 18b are set lower than the impurity concentration of the third extension region 18c. This prevents the excess hot electrons from occurring and entering the first and second gate insulating films 13A and 13B to change the threshold voltages of the first and second MIS transistors Tr1 and Tr2, thereby mitigating reduction in the reliability of the first and second MIS transistors Tr1 and Tr2.

On the other hand, since the operating voltage Vdd3 is lower than the operating voltages Vdd1 and Vdd2, there is no need to consider the above problem (i.e., reduction in the reliability of the MIS transistors due to the hot electrons). This makes the impurity concentration of the third extension region 18c higher than the impurity concentration of the first and second extension regions 18a and 18b. As a result, the drive capability of the third MIS transistor Tr3 is improved.

According to this embodiment, the first gate insulating film 13A has the multilayer structure of the first silicon oxide film 13a and the first high-k insulating film 15a. The second gate insulating film 13B has the multilayer structure of the second silicon oxide film 13b and the second high-k insulating film 15b. As a result, the first silicon oxide film 13a has a same thickness as the second silicon oxide film 13b. The number of heat treatment processes after forming the first, second, and third channel diffusion layers 12a, 12b, and 12c is two (see FIGS. 1A and 1C), and can be reduced as compared to a conventional device. This reduces the number of times that the p-type impurities contained in the first, second, and third channel diffusion layers 12a, 12b, and 12c are diffused. As a result, fluctuations in impurity profiles of the first, second, and third channel diffusion layers 12a, 12b, and 12c can be reduced.

In addition, the first gate insulating film 13A has the multilayer structure of the first silicon oxide film 13a and the first high-k insulating film 15a. The second gate insulating film 13B has the multilayer structure of the second silicon oxide film 13b and the second high-k insulating film 15b. The third gate insulating film 14C has the multilayer structure of the third silicon oxide film 14c and the third high-k insulating film 15c. As such, since the thicknesses of the first, second, and third silicon oxide films 13a, 13b, and 14c can be reduced as compared to a conventional device, the thicknesses of the first and second films 13 and 14 for forming silicon oxide films can be reduced. This reduces the time needed for the first heat treatment (i.e., the heat treatment for forming the first film for forming a silicon oxide film) and the time needed for the second heat treatment (i.e., the heat treatment for forming the second film for forming a silicon oxide film). Thus, in each of the two heat treatment processes, the amount of the diffused p-type impurities contained in the first, second, and third channel diffusion layers 12a, 12b, and 12c can be reduced, thereby reducing fluctuations in the impurity profiles of the first, second, and third channel diffusion layers 12a, 12b, and 12c.

Furthermore, as described above, since the thicknesses of the first, second, and third silicon oxide films 13a, 13b, and 14c can be reduced as compared to a conventional device, the first and second films 13 and 14 for forming silicon oxide films have small thicknesses. Then, the amount of the first, second, and third channel diffusion layers 12a, 12b, and 12c, which is consumed as the first film for forming a silicon oxide film, is reduced in the first heat treatment. The amount of the third channel diffusion layer 12c, which is consumed as the second film for forming a silicon oxide film, is also reduced in the second heat treatment. This mitigates reduction in the heights of the surfaces of the first, second, and third channel diffusion layers 12a, 12b, and 12c as compared to the first, second, and third channel diffusion layers 12a, 12b, and 12c immediately after the formation. (In other words, this mitigates the reduction in the depths of the first, second, and third channel diffusion layers 12a, 12b, and 12c as compared to the first, second, and third channel diffusion layers 12a, 12b, and 12c immediately after the formation.) As a result, fluctuations in the impurity profiles of the first, second, and third channel diffusion layers 12a, 12b, and 12c can be reduced.

As described above, reduction in the number of the heat treatment processes, and shortening of the time for the heat treatment due to reduction in the thickness of the films for forming silicon oxide films effectively reduce fluctuations in the impurity profiles of the first, second, and third channel diffusion layers 12a, 12b, and 12c. Therefore, the first, second, and third MIS transistors Tr1, Tr2, and Tr3 with desired characteristics can be provided.

In this embodiment, for purposes of simplifying the drawings, FIGS. 1A-2C show only the first MIS transistor Tr1 of the plurality of MIS transistors having the operating voltage Vdd1 and included in a semiconductor device. The first MIS transistor Tr1 includes the first gate electrode 17A with the shortest gate length Lg1 (i.e., the first MIS transistor Tr1 requires the highest drive capability). That is, the semiconductor device according to this embodiment includes a plurality of MIS transistors with the operating voltage Vdd1, one or more of the gate electrodes included in the MIS transistors with the operating voltage Vdd1 has/have a gate length greater than the gate length Lg1 (>Lg1).

Similarly, FIGS. 1A-2C show only the second MIS transistor Tr2 of the plurality of MIS transistors having the operating voltage Vdd2 and included in a semiconductor device. The second MIS transistor Tr2 includes the second gate electrode 17B with the shortest gate length Lg2 (i.e., the second MIS transistor Tr2 requires the highest drive capability).

Similarly, FIGS. 1A-2C show only the third MIS transistor Tr3 of the plurality of MIS transistors having the operating voltage Vdd3 and included in a semiconductor device. The third MIS transistor Tr3 includes the third gate electrode 17C with the shortest gate length Lg3 (i.e., the third MIS transistor Tr3 requires the highest drive capability).

Note that, while in this embodiment, an example has been described where the first extension region 18a is formed by implanting only As into the first active region 10a as shown in FIG. 2B, the present disclosure is not limited thereto. For example, the first extension region may be formed by implanting As into the first active region and then implanting phosphorus (P) into the first active region to reduce electric field concentration. At this time, P is implanted into the first active region under the conditions that, for example, energy ranges from 20 keV to 50 keV, and a dose ranges from $1 \times 10^{13}/cm^2$ to $5 \times 10^{13}/cm^2$. In this case, the tail of the impurity profile of the first extension region has a gradual slope as compared to the case where only As is implanted.

In this embodiment, for example, B may be implanted into the second active region before or after forming the second extension region to provide a first p-type pocket region in the second active region under the second extension region. Also, for example, B may be implanted into the third active region before or after forming the third extension region to provide a second p-type pocket region in the third active region under the third extension region.

While in this embodiment, an example has been described using the semiconductor device including the first MIS transistor Tr1 with an operating voltage Vdd1 of 2.5 V, the second MIS transistor Tr2 with an operating voltage Vdd2 of 1.8 V, and the third MIS transistor Tr3 with an operating voltage Vdd3 of 1.0 V, the present disclosure is not limited thereto.

The semiconductor device may include, for example, a first MIS transistor with an operating voltage of 3.3 V, a second MIS transistor with an operating voltage of 2.5 V, and a third MIS transistor with an operating voltage of 1.0V.

In this case, the first gate electrode has a gate length of, for example, 380 nm. The first gate insulating film has a physical thickness of, for example, 7.5 nm, which is the sum of the thickness 5.5 nm of the first silicon oxide film and the thickness 2.0 nm of the first high-k insulating film. The second gate electrode has a gate length of, for example, 250 nm. The second gate insulating film has a physical thickness of, for example, 7.5 nm, which is the sum of the thickness 5.5 nm of the second silicon oxide film and the thickness 2.0 nm of the second high-k insulating film. The third gate electrode has a gate length of, for example, 30 nm. The third gate insulating film has a physical thickness of, for example, 3.0 nm, which is the sum of the thickness 1.0 nm of the third silicon oxide film and the thickness 2.0 nm of the third high-k insulating film.

In this case, the quantitative relationship among the doses Dvt1, Dvt2, and Dvt3 in the first, second, and third Vt implantation satisfies the relationship similar to that in this embodiment (Dvt1<Dvt2<Dvt3). The magnitude relationship among the energy Eex1, Eex2, and Eex3, and the quantitative relationship among the doses Dex1, Dex2, and Dex3 in the first, second, and third Ex implantation satisfy the relationship similar to those in this embodiment (Eex1>Eex2>Eex3, and Dex1≤Dex2<Dex3).

While in this embodiment, an example has been described where the third MIS transistor Tr3 has an operating voltage of 1.0 V, the present disclosure is not limited thereto. Specifically, the third MIS transistor preferably has an operating voltage ranging from 1.1 V to 0.9 V, for example.

While in this embodiment, as shown in FIG. 2B, an example has been described where the first, second, and third extension regions 18a, 18b, and 18c are formed after forming the first, second, and third gate electrodes 17A, 17B, and 17C, the present disclosure is not limited thereto. For example, a first, second, and third offset spacers, each of which is formed of a silicon oxide film or a silicon nitride film with a width ranging from, e.g., several nanometers to, e.g., 10 nm, may be formed on side surfaces of the first, second, and third gate electrodes after forming the first, second, and third gate electrodes, and then the first, second, and third extension regions may be formed.

While in this embodiment, as shown in FIG. 2C, an example has been described where the first gate electrode 17A is formed of the first metal film 16a and the first silicon film 17a, the second gate electrode 17B is formed of the second metal film 16b and the second silicon film 17b, and the third gate electrode 17C is formed of the third metal film 16c and the third silicon film 17c; the present disclosure is not limited thereto. For example, the first, second, and third gate electrodes may be formed of only the first, second, and third metal films, respectively.

While in this embodiment, as shown in FIG. 2C, an example has been described where the first, second, and third sidewalls 19a, 19b, and 19c, each of which is formed of a silicon oxide film (i.e., has a single layer structure), are provided on the side surfaces of the first, second, and third gate electrodes 17A, 17B, and 17C, the present disclosure is not limited thereto. For example, first, second, and third sidewalls respectively including first, second, and third inner sidewalls, each of which has an L-shaped cross-section and is formed of a silicon oxide film, and first, second, and third outer sidewalls provided on the first, second, and third inner sidewalls, respectively and formed of a silicon nitride film (i.e., first, second, and third sidewalls having multilayer structures), may be formed on the side surfaces of the first, second, and third gate electrodes.

While in this embodiment, an example has been described using the semiconductor device including the first, second, and third n-type MIS transistors Tr1, Tr2, and Tr3 having different operating voltages Vdd1, Vdd2, and Vdd3, the present disclosure is not limited thereto. For example, the semiconductor device may include a first, second, and third p-type MIS transistors having different operating voltages.

In this case, conductive impurities of the conductivity type opposite to that in this embodiment are used in the first, second, and third Vt implantation, the first, second, and third Ex implantation, and the S/D implantation.

In this case, the quantitative relationship among the doses Dvt1, Dvt2, and Dvt3 in the first, second, and third Vt implantation, as well as the magnitude relationship among the energy Eex1, Eex2, and Eex3 and the quantitative relationship among the doses Dex1, Dex2, and Dex3 in the first, second, and third Ex implantation are similar to those in this embodiment (i.e., Dvt1<Dvt2<Dvt3, Eex1>Eex2>Eex3, and Dex1≤Dex2<Dex3).

As described above, in the present disclosure, fluctuations in impurity profiles of the first, second, and third channel diffusion layers are reduced. Therefore, the present disclosure is useful as a semiconductor device including a first, second, and third MIS transistors having different operating voltages, and a manufacturing method of the device.

What is claimed is:

1. A semiconductor device comprising:
a first MIS transistor of a first conductivity type including a first gate electrode formed on a first active region of a semiconductor substrate with a first gate insulating film interposed therebetween;
a second MIS transistor of the first conductivity type including a second gate electrode which is formed on a second active region of the semiconductor substrate with a second gate insulating film interposed therebetween, and has a shorter gate length than the first gate electrode;
a third MIS transistor of the first conductivity type including a third gate electrode which is formed on a third active region of the semiconductor substrate with a third gate insulating film interposed therebetween, and has a shorter gate length than the second gate electrode,
a first extension region of the first conductivity type formed in the first active region below a side of the first gate electrode;
a second extension region of the first conductivity type formed in the second active region below a side of the second gate electrode; and
a third extension region of the first conductivity type formed in the third active region below a side of the third gate electrode, wherein
the first gate insulating film is formed of a first silicon oxide film and a first high-k insulating film provided on the first silicon oxide film,
the second gate insulating film is formed of a second silicon oxide film and a second high-k insulating film provided on the second silicon oxide film,
the third gate insulating film is formed of a third silicon oxide film and a third high-k insulating film provided on the third silicon oxide film,
the second silicon oxide film has a substantially same thickness as the first silicon oxide film and a greater thickness than the third silicon oxide film, and
the second extension region has an impurity concentration substantially equal to or higher than an impurity concentration of the first extension region, and lower than an impurity concentration of the third extension region.

2. The semiconductor device of claim 1, further comprising:
a first channel diffusion layer of a second conductivity type formed in the first active region under the first gate insulating film;
a second channel diffusion layer of the second conductivity type formed in the second active region under the second gate insulating film; and
a third channel diffusion layer of the second conductivity type formed in the third active region under the third gate insulating film, wherein
the second channel diffusion layer has an impurity concentration higher than an impurity concentration of the first channel diffusion layer, and lower than an impurity concentration of the third channel diffusion layer.

3. The semiconductor device of claim 1, wherein the second MIS transistor has an operating voltage lower than an operating voltage of the first MIS transistor, and higher than an operating voltage of the third MIS transistor.

4. The semiconductor device of claim 1, wherein the first high-k insulating film, the second high-k insulating film, and the third high-k insulating film have a substantially same thickness.

5. The semiconductor device of claim 1, wherein
the first gate electrode is formed of a first metal film and a first silicon film provided on the first metal film,
the second gate electrode is formed of a second metal film and a second silicon film provided on the second metal film, and
the third gate electrode is formed of a third metal film and a third silicon film provided on the third metal film.

6. The semiconductor device of claim 1, wherein the first high-k insulating film, the second high-k insulating film, and the third high-k insulating film are made of a metal oxide having a relative dielectric constant of 10 or more.

7. The semiconductor device of claim 1, wherein
each of the first silicon oxide film and the second silicon oxide film has a thickness ranging from 3 nm to 6 nm, and
the third silicon oxide film has a thickness ranging from 0.8 nm to 1.2 nm.

8. The semiconductor device of claim 1, wherein the first high-k insulating film, the second high-k insulating film, the third high-k insulating film are made of a same material.

9. The semiconductor device of claim 5, wherein the first metal film, the second metal film, and the third metal film have a substantially same thickness.

10. The semiconductor device of claim 5, wherein the first metal film, the second metal film, and the third metal film are made of a same material.

11. The semiconductor device of claim 5, wherein the first silicon film, the second silicon film, and the third silicon film have a substantially same thickness.

12. The semiconductor device of claim 5, wherein the first silicon film, the second silicon film, and the third silicon film are made of a same material.

13. The semiconductor device of claim 1, wherein the second extension region has a depth shallower than a depth of the first extension region, and greater than a depth of the third extension region.

* * * * *